(12) United States Patent
Rueckerl et al.

(10) Patent No.: US 10,872,783 B2
(45) Date of Patent: Dec. 22, 2020

(54) METHOD FOR STRUCTURING A NITRIDE LAYER, STRUCTURED DIELECTRIC LAYER, OPTOELECTRONIC COMPONENT, ETCHING METHOD FOR ETCHING LAYERS, AND AN ENVIRONMENT SENSOR

(71) Applicant: OSRAM OLED GMBH, Regensburg (DE)

(72) Inventors: Andreas Rueckerl, Konzell (DE); Roland Zeisel, Tegernheim (DE); Simeon Katz, Obertraubling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/714,447

(22) Filed: Dec. 13, 2019

(65) Prior Publication Data
US 2020/0168472 A1 May 28, 2020

Related U.S. Application Data

(62) Division of application No. 15/552,258, filed as application No. PCT/EP2016/053586 on Feb. 19, 2016, now Pat. No. 10,566,210.

(30) Foreign Application Priority Data

Feb. 20, 2015 (DE) .................. 10 2015 102 454

(51) Int. Cl.
*H01L 33/44* (2010.01)
*H01L 31/0232* (2014.01)
(Continued)

(52) U.S. Cl.
CPC .... *H01L 21/3213* (2013.01); *H01L 21/02389* (2013.01); *H01L 31/02327* (2013.01);
(Continued)

(58) Field of Classification Search
None
See application file for complete search history.

(56) References Cited

U.S. PATENT DOCUMENTS 6,309,932 B1 10/2001 Ma et al.
8,279,445 B2 10/2012 Dominguez Horna et al.
(Continued)

FOREIGN PATENT DOCUMENTS

DE 102008003093 A1 7/2008
DE 102004054818 B4 2/2009
(Continued)

OTHER PUBLICATIONS

Wang, C. et al. "Characterization of a High Quality and UV-Transparent PECVD Silicon Nitride Film for Non-Volatile Memory Applications"; SPIE vol. 2335; Oct. 20-21, 1994, Austin, Texas; pp. 282-290.
(Continued)

*Primary Examiner* — Alexander G Ghyka
(74) *Attorney, Agent, or Firm* — MH2 Technology Law Group LLP

(57) ABSTRACT

The invention relates to a method for structuring a nitride layer (2), comprising the following steps: A) providing a nitride layer (2) formed with silicon nitride of a first type, B) defining regions (40) of said nitride layer (2) to be transformed, and C) inserting the nitride layer (2) into a transformation chamber for the duration of a transformation period, said transformation period being selected such that—at least 80% of the nitride layer (2) regions (40) to be transformed are transformed into oxide regions (41) formed with silicon oxide, and—remaining nitride layer (2) regions (21) remain at least 80% untransformed.

18 Claims, 6 Drawing Sheets

(51) Int. Cl.
<table>
<tr><td>H01L 31/0236</td><td>(2006.01)</td></tr>
<tr><td>H01L 31/0304</td><td>(2006.01)</td></tr>
<tr><td>H01L 33/00</td><td>(2010.01)</td></tr>
<tr><td>H01S 5/22</td><td>(2006.01)</td></tr>
<tr><td>H01L 21/3213</td><td>(2006.01)</td></tr>
<tr><td>H01L 21/02</td><td>(2006.01)</td></tr>
</table>

(52) U.S. Cl.
CPC .. *H01L 31/02366* (2013.01); *H01L 31/03044* (2013.01); *H01L 33/0075* (2013.01); *H01L 33/44* (2013.01); *H01S 5/22* (2013.01); *H01L 2933/0025* (2013.01)

(56) References Cited

U.S. PATENT DOCUMENTS

<table>
<tr><td>2002/0182893 A1</td><td>12/2002</td><td>Ballantine et al.</td></tr>
<tr><td>2003/0207535 A1*</td><td>11/2003</td><td>Kutsunai ............... H01L 28/55<br>438/253</td></tr>
<tr><td>2004/0114869 A1</td><td>6/2004</td><td>Fike et al.</td></tr>
<tr><td>2006/0105553 A1</td><td>5/2006</td><td>Wellhausen</td></tr>
<tr><td>2009/0215256 A1</td><td>8/2009</td><td>Hsueh et al.</td></tr>
<tr><td>2010/0108138 A1</td><td>5/2010</td><td>Smith et al.</td></tr>
<tr><td>2010/0181622 A1</td><td>7/2010</td><td>Hamamoto et al.</td></tr>
<tr><td>2012/0275746 A1</td><td>11/2012</td><td>Mossberg et al.</td></tr>
<tr><td>2014/0264853 A1</td><td>9/2014</td><td>Lin et al.</td></tr>
<tr><td>2014/0378328 A1</td><td>12/2014</td><td>Chakravarty et al.</td></tr>
</table>

FOREIGN PATENT DOCUMENTS

<table>
<tr><td>DE</td><td>102008027045 A1</td><td>9/2009</td></tr>
<tr><td>DE</td><td>112013000863 T5</td><td>11/2014</td></tr>
<tr><td>GB</td><td>1234665 A</td><td>6/1971</td></tr>
<tr><td>JP</td><td>201087167 A</td><td>4/2010</td></tr>
</table>

OTHER PUBLICATIONS

DE Application No. 11 2016000 8325.: Examination Report dated Feb. 2, 2019.
Contet, C. et al. "Hydrothermal oxidation of Si3N4 powder", Journal of Materials Science Letters 6 (1987) 963-964.
Kennedy, G. P. et al. "Oxidation of silicon nitride films in an oxygen plasma", Journal of Applied Physics 85, 3319 (1999).
Mizokuro, T. et al. "Mechanism of low temperature nitridation of silicon oxide layers by nitrogen plasma generated by low energy electron impact", Journal of Applied Physics 85, 2921 (1999).
Examination Report dated May 17, 2019 in Germany Application No. 11 2016 000 832.5.
Requirement for Restriction/Election received in U.S. Appl. No. 15/552,258 dated Jul. 19, 2018.
Non-Final Rejection received in U.S. Appl. No. 15/552,258 dated Nov. 30, 2018.
Final Rejection received in U.S. Appl. No. 15/552,258 dated Jun. 6, 2019.
Notice of Allowance received in U.S. Appl. No. 15/552,258 dated Sep. 20, 2019.

* cited by examiner

| 701 | 702 |
|---|---|
| N | 43,8 |
| O | 1,46 |
| Si | 47,77 |

METHOD FOR STRUCTURING A NITRIDE LAYER, STRUCTURED DIELECTRIC LAYER, OPTOELECTRONIC COMPONENT, ETCHING METHOD FOR ETCHING LAYERS, AND AN ENVIRONMENT SENSOR

CROSS-REFERENCE OF RELATED APPLICATIONS

This application is a Divisional of U.S. application Ser. No. 15/552,258, filed on Aug. 18, 2017, which is the U.S. National Phase under 35 U.S.C. § 371 of International Patent Application No. PCT/EP2016/053586, filed on Feb. 19, 2016, which in turn claims the benefit of German Application No. 10 2015 102 454.3, filed on Feb. 20, 2015, the entire disclosures of which Applications are incorporated by reference herein.

DESCRIPTION

Document DE 10 2004 054 818 B4 describes a method for converting a nitride layer.

One object to be achieved consists in providing an improved method for patterning a nitride layer, with which a patterned dielectric layer may be generated. Another object to be achieved consists in providing a patterned dielectric layer, as well as an optoelectronic device and an etching method for etching layers in which in each case a patterned dielectric layer is used. An environment sensor, in which a method for patterning a nitride layer is used, is also to be provided.

A method for patterning a nitride layer is provided. The nitride layer for example comprises a one-piece continuous layer of simply connected configuration in plan view which is formed with a nitride.

According to at least one embodiment of the method, first of all the nitride layer is provided. The nitride layer is formed with a silicon nitride of a first type or consists of silicon nitride of the first type. Silicon nitride of the first type is distinguished here and hereinafter by reduced aging resistance. Furthermore, "aging" here and hereinafter denotes a change in physical and/or chemical characteristics of a substance over time. In other words, under the same ambient conditions the physical and/or chemical characteristics of silicon nitride of the first type change more rapidly when subject to aging than silicon nitride of a second type. Aging of silicon nitride leads, for example, to oxidation of silicon nitride to silicon oxide.

Silicon nitride of the first type may differ from silicon nitride of the second type in the ratio of nitrogen to silicon. Preferably, the N/Si ratio in silicon nitride of the first type is greater than in silicon nitride of the second type. In particular, the silicon nitride of the first type has a non-stoichiometric ratio of N/Si. This also applies in particular to silicon nitride of the second type. Furthermore, the silicon oxide may be $SiO_2$. Silicon nitride of the first type and silicon nitride of the second type may differ in particular in their optical and/or chemical characteristics. For example, silicon nitride of the first type may have higher transmittance for ultraviolet radiation and/or for infrared radiation and/or age more rapidly than silicon nitride of the second type. In particular, silicon nitride of the first and second types may have different microscopic structures.

The nitride layer has a main plane of extension in which it extends in lateral directions. Perpendicular to the lateral direction, in a vertical direction, the nitride layer has a thickness. The thickness of the nitride layer is small relative to the maximum extent of the nitride layer in a lateral direction.

According to at least one embodiment of the method, regions to be transformed of the nitride layer are defined. The regions to be transformed may be sub-regions of the nitride layer or the entire nitride layer. The regions to be transformed may pass right through the nitride layer in the vertical direction. The regions to be transformed are, for example, arranged spaced from one another in a lateral and/or a vertical direction.

According to at least one embodiment of the method, the nitride layer is introduced into a transformation chamber. The transformation chamber may for example comprise an annealing oven. In an annealing oven the temperature and/or the atmospheric humidity may for example be purposefully adjusted. Introduction proceeds for the duration of a transformation period. The transformation period is selected such that at least 60%, in particular at least 80%, preferably at least 90%, of the regions to be transformed of the nitride layer are transformed into oxide regions. The oxide regions are formed with a silicon oxide or consist of silicon oxide. In other words, at least 60%, in particular at least 80% and preferably at least 90%, of the spatial volume and/or of the silicon nitride molecules of the regions to be transformed are transformed into silicon oxide (oxidized). According to at least one embodiment of the method for patterning a nitride layer, said method comprises the following steps:

A) providing the nitride layer, which is formed with a silicon nitride of a first type,
B) defining regions to be transformed of the nitride layer,
C) introducing the nitride layer into a transformation chamber for the duration of a transformation period, which is selected such that at least 80% of the regions to be transformed of the nitride layer are transformed into the oxide regions, which are formed with a silicon oxide.

The method steps are preferably carried out in the stated order.

According to at least one embodiment of the method, remaining regions of the nitride layer remain at least 60%, preferably at least 80%, and particularly preferably at least 90% untransformed. The remaining regions may be regions of the nitride layer not defined previously as regions to be transformed. In other words, at least 60%, in particular at least 80% and preferably at least 90% of the spatial volume and/or of the silicon nitride molecules of the regions not to be transformed of the nitride layer remain as nitride regions.

In the method described here, the idea is in particular to convert a nitride layer in places into an oxide, in particular a silicon nitride layer in places into silicon oxide. In this process the nitrogen of the silicon nitride is replaced by oxygen. This replacement may be detected for example by means of energy-dispersive X-ray spectroscopy (EDX analysis) and/or by means of Fourier transform infrared spectroscopy (FTIR). As a result of the replacement, material characteristics of the nitride layer such as for example refractive index and/or thickness, are modified. In particular, the method may be used to provide a patterned dielectric layer in which silicon oxide and silicon nitride of the first type are arranged next to one another in lateral directions and/or one above the other in the vertical direction, wherein no appreciable boundary surfaces arise between the silicon oxide and the silicon nitride of the first type. As a result of the transformation of the silicon nitride of the first type into silicon oxide, it is in particular possible for boundary regions between silicon oxide and silicon nitride to exhibit few cracks, splits and/or cavities or overlap regions and to have specific optical characteristics. In particular, the optical characteristics in boundary regions between silicon oxide and silicon nitride of the first type may be fundamentally improved. It is moreover possible to dispense with complex processing methods for the patterned deposition of silicon nitride and silicon oxide next to one another and/or on top of one another.

According to at least one embodiment of the method, at least one of the process conditions for transformation in the transformation chamber during method step C) is selected as follows:

temperature of at least 80° C. and at most 200° C.,
pressure of at least 1 bar and at most 15 bar and/or
relative humidity of at least 80% and at most 99%. In particular, during transformation in the transformation chamber during method step C) all three process conditions are as stated above.

A temperature in the range of at least 80° C. and at most 200° C., preferably at least 120° C. and at most 130° C., is suitable in particular for processing optical components which might be destroyed at higher temperatures due to their active optical zone. Alternatively or in addition, the pressure in the transformation chamber may be set in the range of at least 1 bar ($1 \times 10^5$ Pa) and at most 15 bar ($15 \times 10^5$ Pa), preferably at least 1.9 bar ($1.9 \times 10^5$ Pa) and at most 2.3 bar ($2.3 \times 10^5$ Pa). The pressure is thus in the range of ambient pressure under normal conditions at sea level. Furthermore, the transformation chamber may be filled with ambient air which has a relative humidity of at least 80%, preferably at least 90% and at most 99%. Furthermore, the ambient air with which the transformation chamber is filled in particular has an oxygen content of for instance 20%.

According to at least one embodiment of the method, in step A) the nitride layer is applied to a carrier in a deposition chamber by plasma-enhanced chemical vapor deposition (PECVD). The carrier may for example be formed with silicon, germanium or sapphire glass or consist of these materials. In this case, at least one of the deposition conditions is selected as follows:

silane ($SiH_4$) flow rate of at least 4.5% and at most 5.5% of the nitrogen ($N_2$) flow rate,
ammonia ($NH_3$) flow rate of at least 14.5% and at most 16.5% of the nitrogen ($N_2$) flow rate,
total pressure of at least 4800 mTorr (640 Pa) and at most 5200 mTorr (693 Pa), preferably at least 4950 mTorr (660 Pa) and at most 5050 mTorr (673 Pa),
deposition temperature of at least 280° C. and at most 320° C., and/or
plasma power of at least 580 W and at most 620 W.

The deposition conditions for application of the nitride layer are taken to their outer limits. "Outer limits" means here and hereinafter that under the selected deposition conditions the formation of silicon nitride only just takes place. If, in particular, a higher total pressure, a lower silane flow rate and/or a lower nitrogen flow rate is selected than the above-stated deposition conditions, the formation of silicon nitride can no longer be guaranteed. The silane flow rate established and the ammonia flow rate established are here dependent on the established nitrogen flow rate. The nitrogen flow rate is itself dependent in particular on the total volume of the deposition chamber. A greater nitrogen flow rate is for example needed for a larger deposition chamber. The silane flow rate may amount to $(5.25 \pm 0.25)\%$ of the nitrogen flow rate. Furthermore, the ammonia flow rate may amount to $(15.75 \pm 0.25)\%$ of the nitrogen flow rate. For example, silicon nitride of the first type is deposited at a silane flow rate of $(105 \pm 5)$ sccm, an ammonia flow rate of $(315 \pm 5)$ sccm and a nitrogen flow rate of $(2000 \pm 20)$ sccm. It is moreover possible for a temperature of $(300 \pm 5)$ ° C., a pressure of $(5000 \pm 50)$ mTorr and/or a plasma power of $(600 \pm 10)$ W to be established in the deposition chamber.

Silicon nitride of the first type forms under the above deposition conditions. In contrast, silicon nitride of the second type is deposited for example at a silane flow rate of 9% of the nitrogen flow rate and an ammonia flow rate of 22.5% of the nitrogen flow rate. The silane flow rate may for example amount to 180 sccm, the ammonia flow rate to 450 sccm, and the nitrogen flow rate to 2000 sccm. Furthermore, in the deposition chamber a temperature of 300° C., a pressure of 1200 mTorr and a plasma power of 540 W may be established. The silicon nitride of the first type has much lower aging resistance in damp surroundings compared to silicon nitride of the second type.

According to at least one embodiment of the method, in step B) a patterned mask layer is applied to a top face of the nitride layer to define the regions to be transformed. In this case, regions of the nitride layer not covered by the mask layer form the regions to be transformed of the nitride layer. The regions to be transformed may in particular be spaced laterally from one another and/or separated laterally by regions not to be transformed.

By purposeful shading of individual, in particular laterally spaced, regions to be transformed of the nitride layer by means of the mask layer, these regions of the nitride layer are protected during transformation and the silicon nitride is retained in these regions. The transformation to silicon oxide preferably mainly takes place when the ambient atmosphere is able to enter into direct contact with the regions to be transformed. The mask layer lowers the local pressure of water in the ambient atmosphere and thereby prevents it from reaching the masked region. Defined edges may arise in a boundary region between the nitride region and the oxide region. In lateral directions only a few μm, preferably at most 10 μm and particularly preferably at most 3 μm, of the nitride regions arranged vertically beneath the mask layer are converted into oxide regions, for example. This process is known as "under-transformation" and is similar to underetching, which takes place in chemical etching methods. This under-transformation may proceed in particular in lateral directions from a lateral outer edge of the mask directly under the mask laterally away from the outer edge towards the center of the mask.

Suitable materials which may be considered for the mask layer are a hydrophobic material, such as a photoresist, a metal and/or a dielectric, such as for example $Al_2O_3$, with low moisture permeability. In particular, the mask layer may be formed with nickel or consist of nickel. The mask layer may for example have a thickness in the vertical direction of at least 130 nm and at most 170 nm. The mask layer may for example be detached after transformation with $HNO_3$.

According to at least one embodiment of the method, a maximum under-transformation region of the regions of the nitride layer covered by the mask layer is transformed into oxide regions. The under-transformation region for example extends in lateral directions from the outer edge of the mask layer by a few μm, preferably at most 10 μm and particularly preferably at most 3 μm, in lateral directions beneath the mask layer. The under-transformation regions may be the above-mentioned oxide regions, which arise as a result of said under-transformation.

According to at least one embodiment of the method, the regions to be transformed form the entire nitride layer. The nitride layer is thus completely transformed into silicon oxide. The transformation period may lie in the range of a few hours, for example at least 12 hours and at most 20 hours. The nitride layer may for example have a thickness of at least a few nm, preferably at least 100 nm and particularly preferably at least 200 nm, and at most a few µm, preferably at most 5 µm and particularly preferably at most 2 µm.

A patterned dielectric layer is further provided. The patterned dielectric layer may be produced using a method as described here for patterning a nitride layer. In other words, all the features disclosed for the method are also disclosed for the patterned dielectric layer and vice versa.

According to at least one embodiment, the patterned dielectric layer comprises a main plane, in which the patterned dielectric layer extends in lateral directions. The main plane may be the main plane of extension of the nitride layer. Furthermore, the patterned dielectric layer comprises at least one oxide region, which is formed with a silicon oxide or consists of silicon oxide, and at least one nitride region, which is formed with a silicon nitride of the first type or consists of silicon nitride of the first type.

Between the oxide region and the nitride region at least one boundary region is arranged. The boundary region directly adjoins the oxide region and the nitride region. The concentration of silicon oxide in the boundary region decreases continuously away from the oxide region and towards the nitride region and/or the concentration of silicon nitride of the first type increases continuously in the boundary region away from the oxide region and towards the nitride region. In other words, in the boundary region a continuous transition from silicon nitride of the first type to silicon oxide may be observed. "Continuous" corresponds here and hereinafter to the curve of a mathematically continuous function. Preferably, the function is here a monotonically increasing or decreasing continuous function and particularly preferably a quasi-continuous, monotonically increasing or decreasing continuous function. A quasi-continuous function in particular takes account of the structure of the oxide regions and nitride regions, made up of atoms, or the quantum-mechanical structure of the patterned dielectric layer.

From the continuous transition, a method for converting silicon nitride into silicon oxide, for example the above-described production method, may be detected at the finished patterned dielectric layer. In the case of an alternative boundary region, which is arranged between an alternative nitride region and an alternative oxide region, which have both been applied by means of chemical or physical vapor deposition, discrete transition from silicon oxide to silicon nitride would be established. In particular, the alternative boundary region would take the form of a characteristic trench or a characteristic topography between silicon oxide and silicon nitride.

According to at least one embodiment of the patterned dielectric layer, silicon nitride of the first type has a higher transmittance for ultraviolet radiation, a higher energy band gap, a higher transmittance for infrared radiation and/or a lower refractive index compared with silicon nitride of a second type. For example, the refractive index of silicon nitride of the first type is at least 0.1 and at most 0.8, preferably at least 0.2 and at most 0.6, lower than the refractive index of silicon nitride of the second type. Here and hereinafter, the statement of refractive index relates in each case to a value at a wavelength of 600 nm. Silicon nitride of the first type may thus differ from silicon nitride of the second type in its optical characteristics. These may for example be detected experimentally at the patterned dielectric layer by means of spectroscopy, such as FTIR and/or preferably UV/Vis spectroscopy.

The refractive index of silicon nitride of the first type amounts for example to at least 1.7 and at most 1.8. In comparison thereto, the refractive index of silicon nitride of the second type may amount to at least 1.9 and at most 2.1.

According to at least one embodiment of the dielectric layer, silicon nitride of the first type has a higher porosity than silicon nitride of the second type. The porosity of a material constitutes the ratio of cavity volume, which is filled with air for example, to total volume.

According to at least one embodiment of the patterned dielectric layer, the oxide region results from transformation of regions of a nitride layer formed with silicon nitride of the first type. This transformation may for example be detected at the patterned dielectric layer from the physical, chemical and/or optical characteristics of the nitride regions. Furthermore, it is possible to detect the transformation at the patterned dielectric layer from the physical, chemical and/or optical characteristics of the boundary regions between the oxide regions and the nitride regions.

According to at least one embodiment of the patterned dielectric layer, the boundary region comprises a smaller number of cracks, splits and/or cavities ("voids") than the alternative boundary region between the alternative nitride region, which is formed with silicon nitride of the second type, and the alternative oxide region, which is applied by chemical or physical vapor deposition. When producing an alternative patterned dielectric layer, which comprises the alternative boundary regions, by means of deposition, the nitride regions and the oxide regions are applied in chronological succession. In this way, cracks, splits and/or cavities and/or overlap regions form in the alternative boundary regions. Furthermore, grain boundaries and/or defects may form. This formation of cracks, splits and/or cavities may be prevented by using the transformation of silicon nitride of the first type. Due to the reduced number of cracks, splits and/or cavities in the boundary regions of the patterned dielectric layer, the latter has a longer service life, since water and/or ambient air are less able to penetrate than in the case of the alternative patterned dielectric layer. Furthermore, this may result in other optical characteristics, in particular improved optical transitions, in the boundary regions.

According to at least one embodiment of the patterned dielectric layer, the at least one oxide region is arranged in a vertical direction on the at least one nitride region. The refractive index of the patterned dielectric layer decreases continuously in the vertical direction from the nitride regions to the oxide region. Reduction in the refractive index here takes place in particular in the boundary region between the nitride region and the oxide region. There are thus no jumps in refractive index, so enabling good optical transition in the boundary region and reducing light losses.

According to at least one embodiment of the patterned dielectric layer, the latter comprises a multiplicity of oxide regions and a multiplicity of nitride regions. The oxide regions and the nitride regions are arranged alternately in the lateral direction and are each separated from one another by a boundary region. For example, in a plan view from the vertical direction onto the patterned dielectric layer the oxide regions and the nitride regions form a checkerboard pattern or a stripe pattern.

It is possible for the oxide regions and the nitride regions to be vertically higher or lower. In other words, the oxide regions and the nitride regions have non-uniform thicknesses.

For example, the thickness of the oxide regions amounts to at least 110%, preferably at least 120%, and at most 140%, preferably at most 130%, of the thickness of the nitride regions. The nitride regions may for example have a thickness of (600±10) nm, while the oxide regions have a thickness of (750±10) nm.

An optoelectronic device, an etching method for etching layers, and an environment sensor are also provided. A patterned dielectric layer as described here is used in the optoelectronic device and the etching method for etching layers. Furthermore, a method as described here for patterning a nitride layer is use in the environment sensor. That is to say that all the features disclosed for the patterned dielectric layer and the method are also disclosed for the optoelectronic device, the environment sensor and the etching method for etching layers and vice versa.

According to at least one embodiment of the optoelectronic device, the latter comprises a patterned dielectric layer. The optoelectronic device further comprises an active zone, which emits and/or absorbs light when the optoelectronic device is in operation. The dielectric layer may be arranged spaced in the vertical direction and/or in the lateral direction relative to the active zone. For example, the optoelectronic device is a light-emitting diode chip, a laser diode chip, a photodiode chip and/or a solar cell chip.

According to at least one embodiment of the optoelectronic device, the patterned dielectric layer forms an optical grating for the emitted and/or absorbed light. The nitride regions and the oxide regions are then distributed periodically in the patterned dielectric layer. A grating spacing of the optical grating is determined by the spacing of the successive nitride regions and oxide regions. By alternating the refractive indices of the nitride regions and the oxide regions, it is possible to achieve periodic diffraction and/or interference of the light emitted and/or absorbed by the active zone. By continuous modification of the refractive index in the boundary region, fewer losses occur in an optical grating formed by the patterned dielectric layer than with an alternative patterned dielectric layer. Since in the case of the alternative patterned dielectric layer refractive index transition does not proceed continuously, but rather in discrete, stepped manner and in addition an increased number of cracks, splits and/or cavities is present in the alternative boundary region, said layer is suitable only to a degree as an optical grating.

The optoelectronic device is for example a Distributed Feedback (DFB) laser, in which the patterned dielectric layer forms a supergrating. Mode coupling within the laser is sometimes achieved when a multiple of the frequency of the generated laser mode corresponds to the grating spacing of the optical grating. Conventionally, metals are used in DFB lasers for the supergrating, since they do not result in the problems of cracks, splits and/or cavities in the alternative boundary regions which arise with alternative patterned dielectric layers. A patterned dielectric layer as described here has the advantage of improved boundary regions and the use of dielectrics.

Alternatively or in addition, the patterned dielectric layer may form a Bragg reflector (Distributed Bragg Reflector, DBR). It is also possible for the patterned dielectric layer to form a waveguide for the light emitted and/or absorbed by the device.

Furthermore, the optical grating formed by the patterned dielectric layer may be used for frequency modulation, for example by waveguide patterning in the case of a waveguide deposited on a carrier. In addition, the optical grating formed by the patterned dielectric layer is suitable as an optical phase grating, with which the phase of the light wave passing through is influenced.

In general, the absorption of light may be reduced in comparison with the above-described alternative boundary region by the reduction in cracks, splits and/or cavities in the boundary region between the nitride region and the oxide region. This in particular allows increased efficiency and/or a increased luminous efficacy of the optoelectronic device. In particular, particularly efficient passive optical elements, such as for example waveguides, phase modulators and/or multiplexers based on thin-film technology, may be produced by means of the patterned dielectric layer.

According to at least one embodiment of the optoelectronic device, the patterned dielectric layer forms an outcoupling layer for the emitted and/or absorbed light and/or the oxide region forms an antireflection layer for the emitted and/or absorbed light. The patterned dielectric layer may then be patterned for example in the vertical direction, resulting in a continuous reduction in the refractive index in the direction away from the active zone. This provides a simple way, for example, of providing an antireflection layer in an optoelectronic semiconductor chip, for example a solar cell chip.

According to at least one embodiment of an etching method for etching layers, first of all a layer sequence is provided, which comprises a patterned dielectric layer as described here. The layer sequence may for example contain semiconductor layers, metal layers and/or dielectric layers. Furthermore, an etching solution is provided, which is designed to etch the layer sequence at least in part. The layer sequence is then removed at least in part with the etching solution. The etching solution has a higher etching rate for the material of the oxide regions than for the material of the nitride regions or vice versa. In other words, the oxide regions and the nitride regions are selectively etchable with the etching solution. The nitride regions or conversely the oxide regions then form an etch stop layer in the layer sequence.

According to at least one embodiment of an environment sensor, the latter comprises a nitride layer which is formed with silicon nitride of the first type. Furthermore, the environment sensor comprises a detection unit. The detection unit may be directly integrated into the environment sensor. It is however alternatively possible for the detection unit to be an external detection unit, which is mounted outside the environment sensor. The environment sensor is designed to detect the process conditions for the transformation of silicon nitride of the first type into silicon oxide by at least partial transformation of the nitride layer into oxide regions. In particular, to this end the detection unit is designed to detect oxide regions in the nitride layer. For example, the detection unit contains an optical unit, by means of which the nitride layer is optically analyzed, for example by means of spectroscopy, and the possible at least partial transformation of the nitride layer into oxide regions may be detected. The environment sensor may thus irreversibly detect an aging environment. An "aging environment" here corresponds to an environment in which partial transformation of the nitride layer into oxide regions may take place. In particular, the above-described process conditions for transformation prevail in an "aging environment".

BRIEF DESCRIPTION OF THE FIGURES

The method described here, the patterned dielectric layer described here, the optoelectronic device described here, the etching method described here for etching layers, and the environment sensor described here are explained in greater detail below with reference to exemplary embodiments and the associated figures.

Figure 1A:
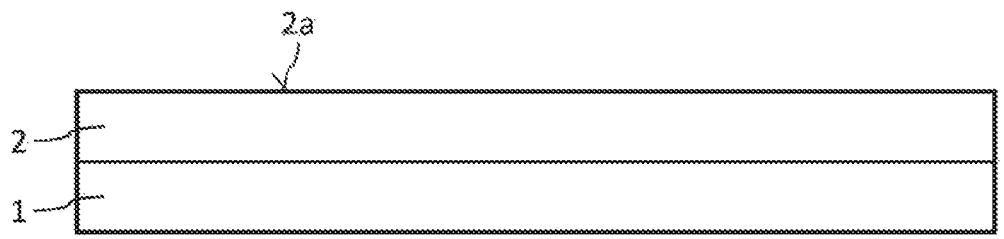
FIGS. 1A to 1D show an exemplary embodiment of a method as described here for patterning a nitride layer, and an exemplary embodiment of a patterned dielectric layer as described here.

Identical, similar and identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

A method as described here for patterning a nitride layer 2 is explained in greater detail with reference to the schematic sectional representations in FIGS. 1A to 1D. In the first method step shown in FIG. 1A, a nitride layer 2 applied to a carrier 1 is provided with a top face 2a remote from the carrier 1. The nitride layer 2 is formed with silicon nitride of the first type. The carrier 1 is for example formed with silicon or consists of silicon. For example, the nitride layer 2 was applied to the carrier 1 using PECVD, wherein the deposition conditions were selected as described above.

Figure 1B:
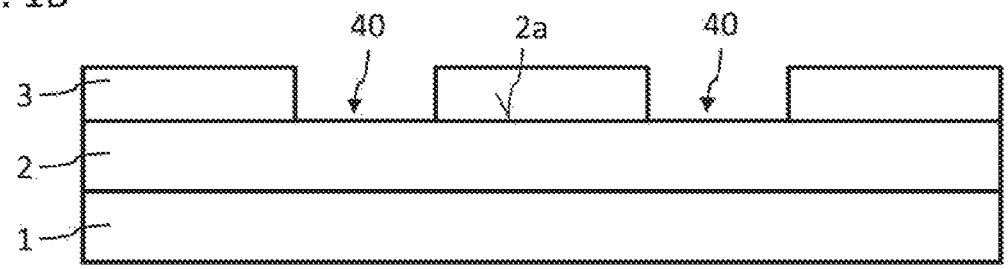

In the second method step shown in FIG. 1B, a mask layer 3 is applied to the top face 2a of the nitride layer 2. The mask layer is patterned, such that the top face 2a of the nitride layer 2 is covered in places. Regions of the nitride layer 2 which are not covered and which are freely accessible on the top face 2a form the regions 40 to be transformed. For example, the mask layer 3 is formed with a photoresist, a metal, such as for example nickel, and/or a hydrophobic material.

Figure 1C:
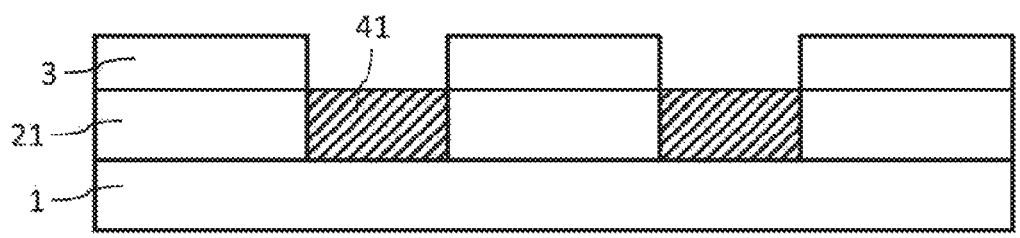

In the method step shown in FIG. 1C, the regions 40 to be transformed of the nitride layer 2 are transformed into oxide regions 41. The transformation proceeds for example by means of introduction into a transformation chamber for the duration of a transformation period under the above-described process conditions. The transformation period and/or the process conditions are selected such that at least 80% of the regions 40 to be transformed are transformed into oxide regions 41. In the regions 21 of the nitride layer 2 covered by the mask layer, said nitride layer remains at least 80% untransformed.

Figure 1D:
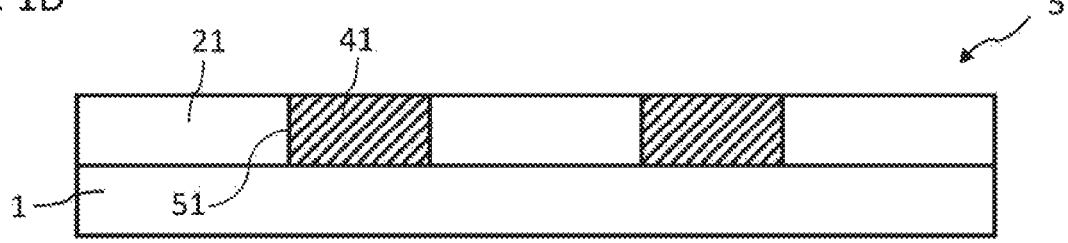

In the last method step shown in FIG. 1D, the mask layer 3 is removed and a patterned dielectric layer 5 is present. The patterned dielectric layer 5 comprises the oxide regions 41, which result from transformation of the regions 40 to be transformed of the nitride layer 2, and the untransformed nitride regions 21. Boundary regions 51 are arranged between the nitride regions 21 and the oxide regions 41.

Figure 2:
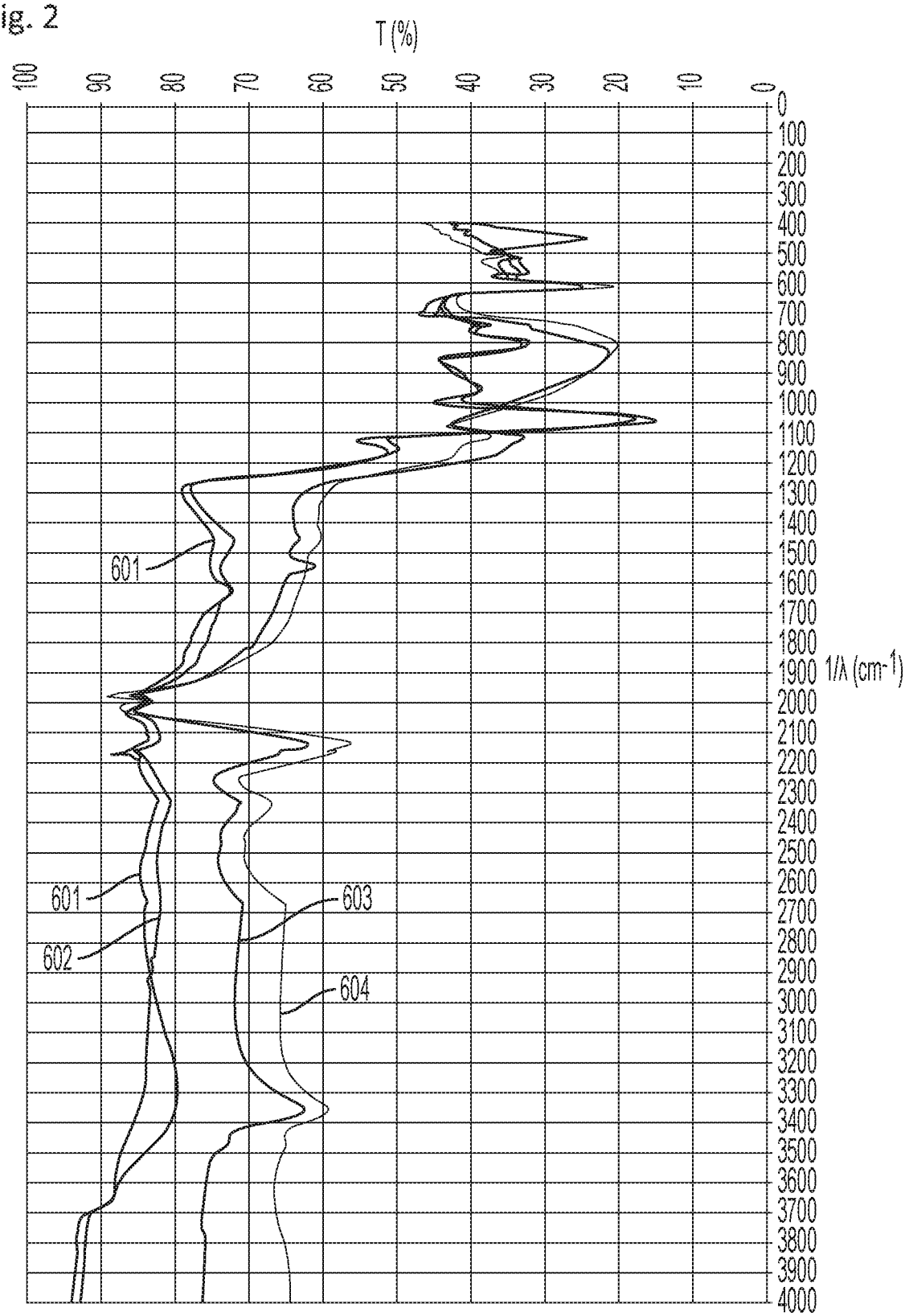
FIG. 2 shows FTIR spectra.

On the basis of the FTIR spectra of FIG. 2, a patterned dielectric layer 5 as described here and silicon nitride of the first type are explained in greater detail. The spectra show in each case the percentage transmittance T as a function of the wavenumber 1/λ. A first spectrum 601 illustrates the transmittance T in the case of silicon oxide produced by the transformation described. A second spectrum 602 illustrates the transmittance T in the case of alternative silicon oxide, which has been deposited. A third spectrum 603 shows the transmittance T in the case of silicon nitride of the first type and a fourth spectrum 604 shows the transmittance T in the case of silicon nitride of the second type.

Within the bounds of conventional measurement inaccuracies, no significant difference in transmittance T is discernible between the first spectrum 601 and the second spectrum 602. The silicon oxide generated by transformation from silicon nitride of the first type thus does not differ significantly from alternative silicon oxide deposited by chemical or physical vapor deposition.

Figures 3A, 3B:
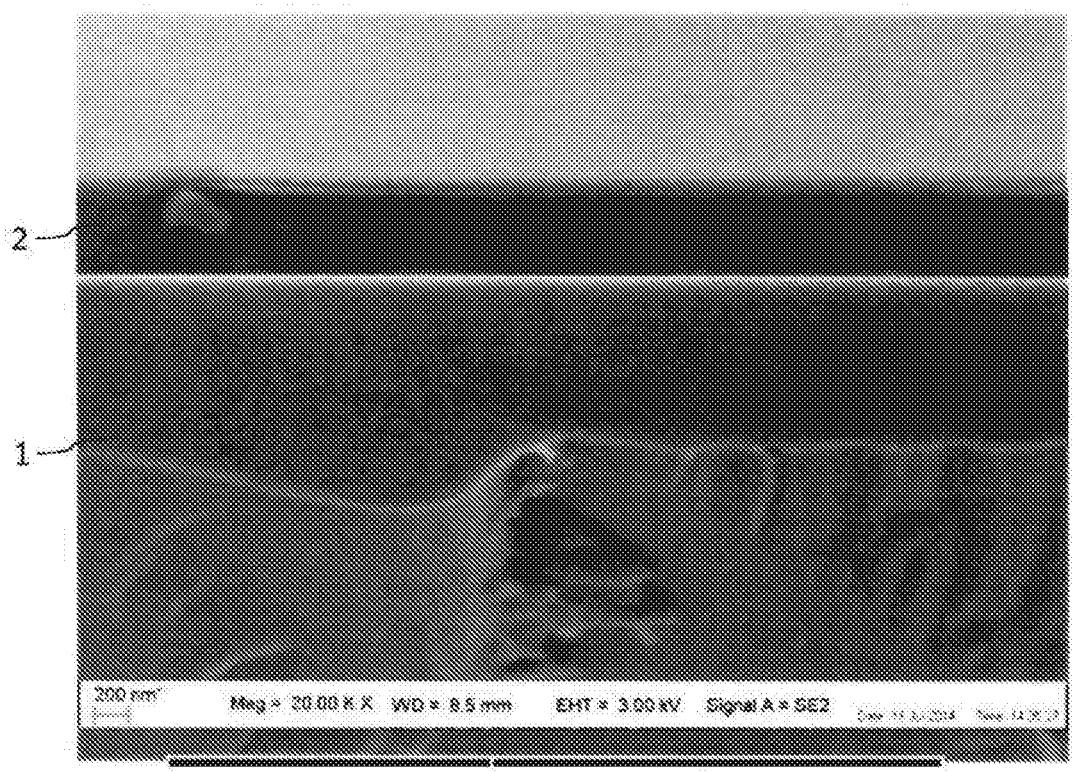
FIGS. 3A, 3B, 4A and 4B show scanning electron microscope (SEM) micrographs and EDX analyses.

FIG. 3A shows an SEM micrograph of a nitride layer 2 applied to a carrier 1 prior to conversion, in sectional representation. FIG. 3B shows an EDX analysis of the element distribution in the nitride layer 2 prior to conversion. The left-hand column lists the chemical elements 701 and the right-hand column the atomic percent 702. Prior to conversion, the nitride layer 2 has a percentage nitrogen content of 43.8%, a percentage oxygen content of 1.46%, and a percentage silicon content of 47.77%.

Figures 4A, 4B:
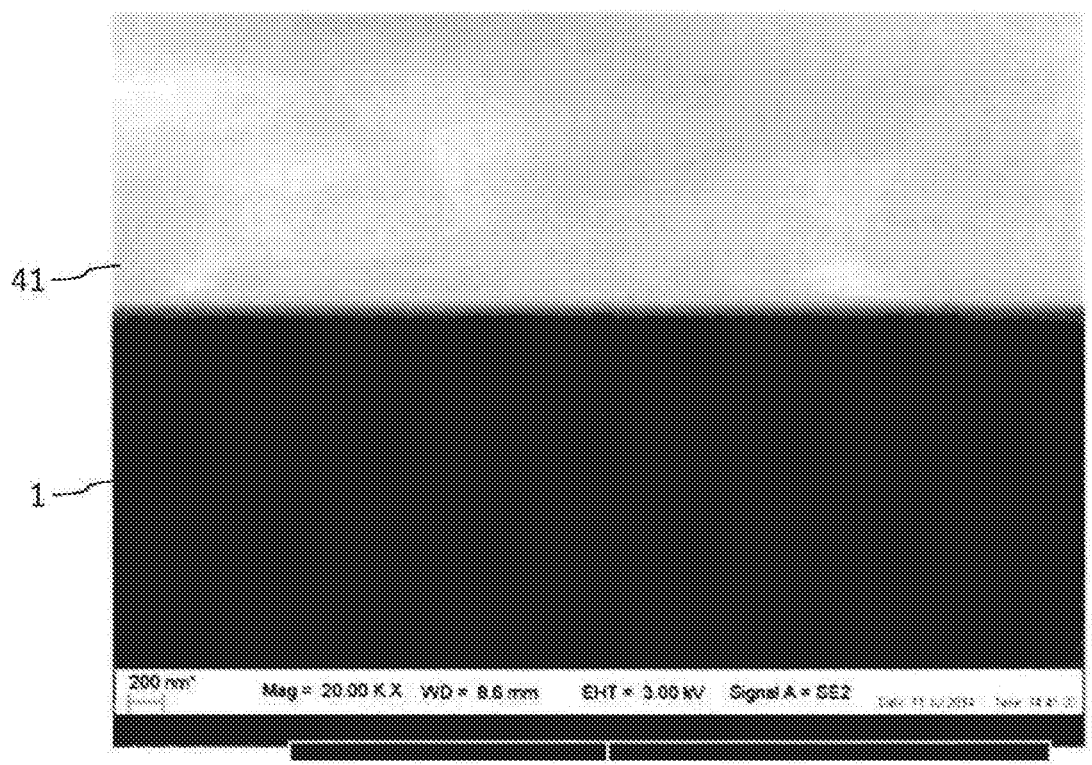

FIG. 4A shows an SEM micrograph of the nitride layer 2 of FIG. 3A, after the latter has been completely transformed into a single oxide region 41. FIG. 4B shows an EDX analysis of the oxide regions 41 of FIG. 4A after transformation. The percentage nitrogen content has decreased to 1.3% in comparison with the percentage nitrogen content of FIG. 3B. The percentage oxygen content has increased to 55.22% and the percentage silicon content has remained substantially the same, at 36.39%. The conversion of the silicon nitride of the first type into silicon oxide is discernible in particular from the major reduction in nitrogen content and the major increase in oxygen content.

Figure 5A:
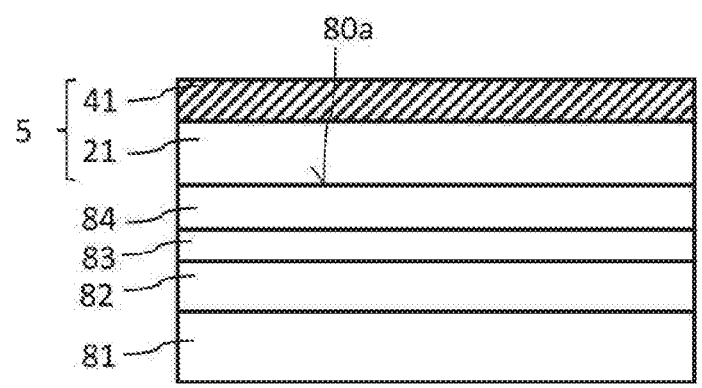
FIGS. 5A, 5B and 5C show exemplary embodiments of an optoelectronic device as described here.

An exemplary embodiment of an optoelectronic device described here is explained in greater detail with reference to the schematic sectional representation of FIG. 5A. In FIG. 5A a layer sequence 82, 83, 84, with active zone 83, is applied to a connection carrier 81. On the side of the second semiconductor layer 84 remote from the connection carrier 81, the patterned dielectric layer 5, with a nitride region 21 and an oxide region 41, is applied to a light passage face 80a of the layer sequence 82, 83, 84. The patterned dielectric layer 5 is patterned in the vertical direction. Outcoupling or incoupling of the light respectively emitted or absorbed by the active zone 83 thus proceeds via the patterned dielectric layer 5 and in particular via the oxide region 41 and the nitride region 21. The patterned dielectric layer 5 then functions respectively as an outcoupling layer or as an antireflection layer of the optoelectronic device.

Figure 5B:
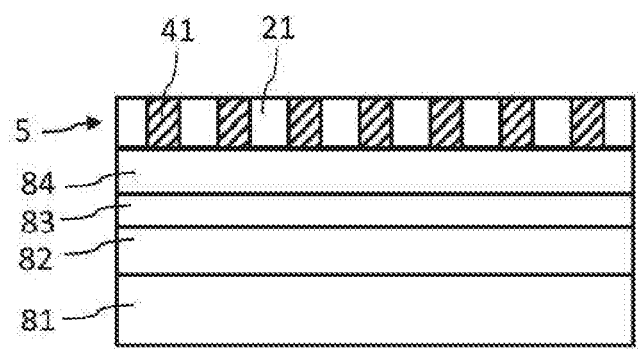

An alternative exemplary embodiment of an optoelectronic device described here is explained in greater detail with reference to the schematic sectional representation of FIG. 5B. The structure resembles that of FIG. 5A, however the patterned dielectric layer 5 is now patterned in the lateral direction and comprises a plurality of alternately arranged oxide regions 41 and nitride regions 21. The patterned dielectric layer 5 in the exemplary embodiment of FIG. 5B for example has the function of an optical grating.

Figure 5C:
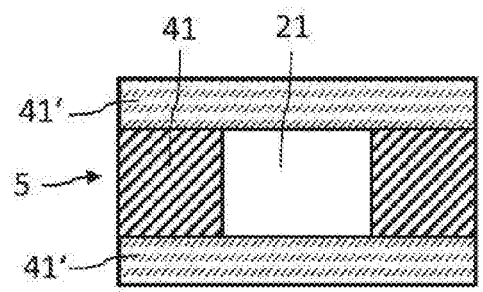

An alternative exemplary embodiment of an optoelectronic device described here is explained in greater detail with reference to the schematic sectional representation of FIG. 5C. In the exemplary embodiment shown, the active zone 83 of the device is not shown. The device comprises a patterned dielectric layer 5 and two oxide layers 41'. The oxide layers 41' are formed with silicon oxide or consist of silicon oxide. The nitride region 21 of the patterned dielectric layer 5 is thus enclosed by two oxide regions 41 and two oxide layers 41'. The nitride region 21 of the patterned dielectric layer 5 functions in the present exemplary embodiment as a waveguide for the light emitted and/or absorbed by the active zone 83.

Figure 6A:
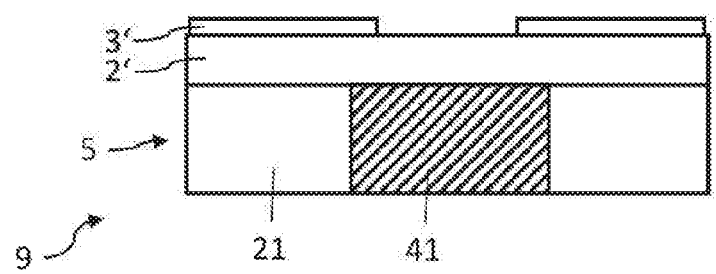
FIGS. 6A and 6B show an exemplary embodiment of an etching method as described here for etching layers.

An etching method as described here for etching layers is explained in greater detail with reference to the schematic sectional representations in FIGS. 6A and 6B. In the method step illustrated in FIG. 6A, a layer sequence 9 containing a patterned dielectric layer 5 is provided. Patterning may proceed prior to introduction of the patterned dielectric layer 5 into the layer sequence 9. Alternatively, it is possible for a nitride layer 2, which is formed with silicon nitride of the first type, firstly to be introduced into the layer sequence 9 and for the patterning then to proceed by means of transformation into silicon oxide.

The layer sequence 9 further comprises a further nitride layer 2', which may be formed with silicon nitride of the first or second type. The side of the further nitride layer 2' remote from the patterned dielectric layer 5 is partially covered by a mask layer 3', which is formed for example with a photoresist.

Figure 6B:
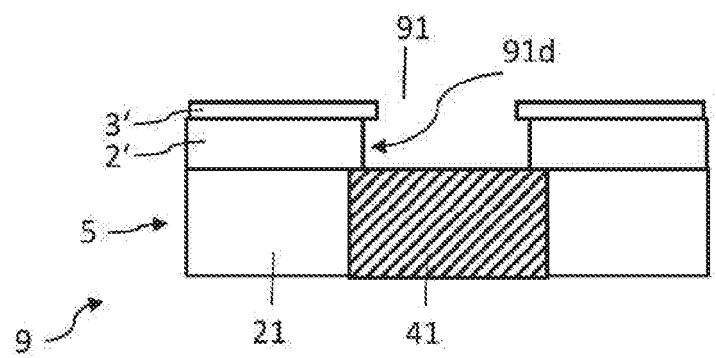

In the method step shown in FIG. 6B, the further nitride layer 2' has been partially removed with an etching solution and the mask layer 3' is removed. The regions not previously covered by the mask layer 3' are removed, resulting in a trench 91. An underetch 91d is also present beneath the mask layer 3'.

In the present exemplary embodiment, the etching solution has a lower etching rate for the material of the oxide region 41 than for the material of the nitride regions 21 and/or the material of the further nitride layer 2'. The oxide region 41 then serves as an etch stop layer. In other words, the oxide region 41 is not etched by the etching solution and etching terminates at the oxide region 41. In this way, the etching depth, in particular the depth of the trench 91, may be purposefully controlled.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS

1 Carrier
2,2' Nitride layer
2a Top face
21 Nitride regions
3,3 Mask layer
40 Regions to be transformed
41 Oxide regions
41' Oxide layer
5 Patterned dielectric layer
51 Boundary regions
601 First spectrum
602 Second spectrum
603 Third spectrum
604 Fourth spectrum
701 Chemical element
702 Atomic percent
80a Light passage face
81 Connection carrier
82 First semiconductor layer
83 Active zone
84 Second semiconductor layer
9 Layer sequence T Transmittance
1/λ Wavenumber

What is claimed is:

1. An optoelectronic device comprising:
    a patterned dielectric layer, and
    an active zone, which emits and/or absorbs light when the optoelectronic device is in operation, wherein
        the patterned dielectric layer comprises
            a main plane, in which the patterned dielectric layer extends in lateral directions,
            at least one oxide region, which is formed with silicon oxide,
            at least one nitride region, which is formed with silicon nitride of a first type and
            at least one boundary region, which is arranged between the oxide region and the nitride region and directly adjoins the oxide region and the nitride region, and wherein
        the concentration of silicon oxide in the boundary region decreases continuously away from the oxide region and towards the nitride region and/or the concentration of silicon nitride of the first type increases continuously in the boundary region away from the oxide region and towards the nitride region.

2. The optoelectronic device according to claim 1, wherein the patterned dielectric layer forms an optical grating for the emitted and/or absorbed light.

3. The optoelectronic device according to claim 1, wherein the patterned dielectric layer forms an outcoupling layer for the emitted radiation and/or the oxide region forms an antireflection layer for the emitted and/or absorbed light.

4. The optoelectronic device according to claim 1, wherein a ratio of nitrogen to silicon in the silicon nitride of the first type is greater than a ratio of nitrogen to silicon in a silicon nitride of a second type, wherein:
    the silicon nitride of the second type is a material that is deposited using a silane flow rate, a nitrogen flow rate, and an ammonia flow rate; and
    the silane flow rate is 9% of the nitrogen flow rate and the ammonia flow rate is 22.5% of the nitrogen flow rate during the deposition of the silicon nitride of the second type.

5. The optoelectronic device according to claim 4, wherein silicon nitride of the first type has a higher transmittance for UV radiation, a higher energy band gap and/or a higher transmittance for IR radiation compared with the silicon nitride of the second type.

6. The optoelectronic device according to claim 4, wherein silicon nitride of the first type has a higher porosity than the silicon nitride of the second type.

7. The optoelectronic device according to claim 1, wherein the oxide region results from transformation of regions of a nitride layer which is formed with silicon nitride of the first type.

8. The optoelectronic device according to claim 4, in which the boundary region comprises a smaller number of cracks, splits and/or cavities or overlaps than a boundary region between the silicon nitride of the second type and an oxide region applied by chemical or physical vapor deposition.

9. The optoelectronic device according to claim 1, wherein the oxide region is arranged in the vertical direction on the nitride region and the refractive index of the patterned dielectric layer decreases continuously from the nitride region to the oxide region.

10. The optoelectronic device according to claim 1, comprising a multiplicity of oxide regions and a multiplicity of nitride regions, wherein the oxide regions and the nitride regions are arranged alternately in the lateral direction and are each separated from one another by a boundary region.

11. The optoelectronic device according to claim 4, wherein physical and/or chemical characteristics of the silicon nitride of the first type change more rapidly when subject to aging than physical and/or chemical characteristics of the silicon nitride of the second type when subject to the aging.

12. The optoelectronic device according to claim 4, wherein silicon nitride of the second type is a material that is deposited at a within a chamber at a temperature of 300° C., a pressure of 1200 mTorr, and a plasma power of 540 watts.

13. The optoelectronic device according to claim 4, wherein silicon nitride of the first type has a lower refractive index than the silicon nitride of the second type.

14. The optoelectronic device according to claim 1, wherein no appreciable boundary surface arises between the silicon oxide and the silicon nitride of the first type.

15. The optoelectronic device according to claim 1, wherein the silicon nitride of the first type has a refractive index of at least 1.7 and at most 1.8.

16. The optoelectronic device according to claim 4, wherein the boundary region comprises a smaller number of cracks, splits and/or cavities than a boundary region between the silicon nitride of the second type and an oxide region applied by chemical or physical vapor deposition.

17. The optoelectronic device according to claim 1, wherein the at least one oxide region is arranged in a vertical direction on the at least one nitride region.

18. The optoelectronic device according to claim 1, wherein the oxide regions and the nitride regions have non-uniform thicknesses.

* * * * *